United States Patent [19]

Instance

[11] 4,237,386
[45] Dec. 2, 1980

[54] PLUG-IN MODULE FOR TOUCH CONTROL SWITCHING

[75] Inventor: Michael M. Instance, Peakhurst, Australia

[73] Assignee: E-Comm Australia Pty. Ltd., New South Wales, Australia

[21] Appl. No.: 10,622

[22] Filed: Feb. 9, 1979

Related U.S. Application Data

[63] Continuation-in-part of Ser. No. 806,355, Jun. 14, 1977, abandoned.

[30] Foreign Application Priority Data

Jun. 29, 1976 [AU] Australia ............................. 6456/76

[51] Int. Cl.³ ...................... H01H 35/00; H01R 33/30
[52] U.S. Cl. ...................................... 307/116; 200/51.1
[58] Field of Search ................ 200/51.02, 51.1, 51.11, 200/51 R, DIG. 1; 307/114, 116, 117, 139, 157, 308; 339/19

[56] References Cited

U.S. PATENT DOCUMENTS

| | | | |
|---|---|---|---|
| 1,303,464 | 5/1919 | Davis | 200/51.1 |
| 1,551,267 | 8/1925 | Schenck et al. | 200/51.1 |
| 2,819,358 | 1/1958 | Waldrop | 200/51.1 |
| 2,851,550 | 9/1958 | Searcy | 200/51.02 |
| 3,334,250 | 8/1967 | Gwin | 200/51.1 |
| 3,418,488 | 12/1968 | Platzer | 307/252 B |
| 3,493,791 | 2/1970 | Adelson et al. | 307/308 |
| 3,523,212 | 8/1970 | Murphy | 200/51.1 |
| 3,679,910 | 7/1972 | Williams | 307/308 |
| 3,928,737 | 12/1975 | Prasert | 307/114 |

*Primary Examiner*—John W. Shepperd
*Attorney, Agent, or Firm*—Ostrolenk, Faber, Gerb & Soffen

[57] ABSTRACT

A touch-operated switch for electrical apparatus which includes a power connection to the apparatus, a serially connected power socket in the connection provided with a pair of terminal jacks each in the form of make-before-break electrical contacts, a plug-in module containing an electronic circuitry including a solid state power switch, two terminal means on the module for plugging into said terminal jacks, one of said terminal means comprising a pair of electrically discrete pins engaging with respective ones of the electrical contacts of one of said terminal jacks to make electrical connection therewith while opening said contacts, said pins being connected across said power switch, an energizing circuit for the electronic circuitry connected between both said terminal means, and a touch-sensitive control circuit in said electronic circuitry for controlling the operation of said power switch.

5 Claims, 6 Drawing Figures

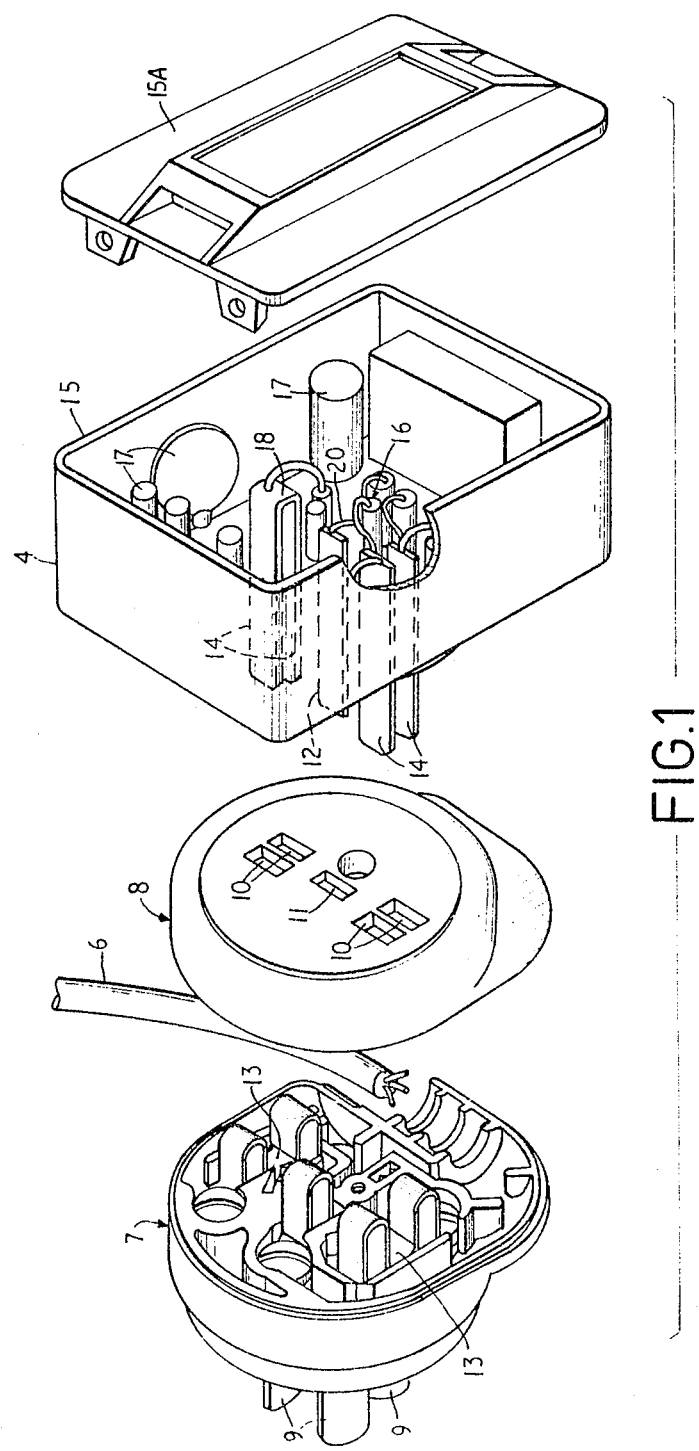

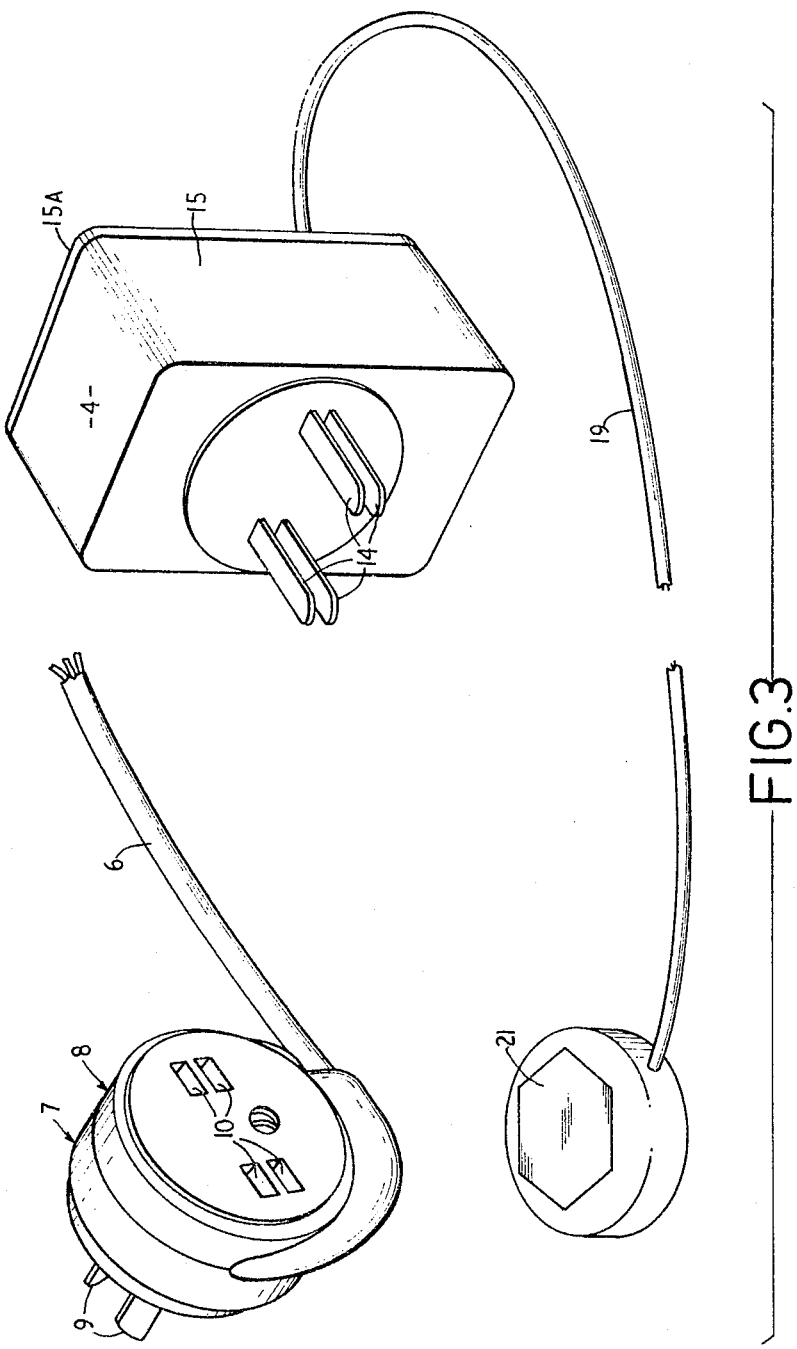

PLUG-IN MODULE FOR TOUCH CONTROL SWITCHING

This application is a continuation-in-part of my co-pending U.S. patent application No. 806,355 filed June 14, 1977 now abandoned entitled Plug-In Module For Touch Control Switching.

In particular, this invention relates to touch-control power switches, i.e. a switch for power to a load such as an electrical appliance, or other apparatus, which responds to human touch.

Several different forms of touch-control electronic switches are presently available, one of which is the subject of Australian Pat. No. 493,215 which issued from Application Ser. No. 10515/76. Although these switches ae reliable and safe in use they have two drawbacks. Firstly, their electronic switching circuitry is provided as an integral part of the apparatus, or at least its power connection section, thus rendering the apparatus unserviceable in the event of an electronic fault developing frequently requiring return to the vendor of the entire apparatus.

Secondly, the electronic circuitry which is utilized requires to be connected to the power in a predetermined sense and lack of knowledge of this requirement sometimes results in inconvenience to the user and unwarranted complaints of faulty equipment.

Typically, touch-control electronic switches utilize solid state devices in the semiconductor controlled rectifier class, such as an SCR (for half wave rectification of power to the load) or a Triac (for full wave rectification). One such switch of the former catagory is described in U.S. Pat. No. 3,493,791 issued Feb. 3, 1970 to A. M. Adelson et al. for a Two-Wire Solid State Touch Responsive Semiconductor Switch Circuit. This switch provides A.C. power to the load only while the touch-responsive antenna, or sensor, is receiving pick-up from an external body, but more recently developed switches otherwise of similar form employ such elements as a bistable multi-vibrator to trigger the SCR or Triac firstly ON and then OFF with successive sensor pick-up responses. It is also now common practice to incorporate the switch circuitry within the controlled appliance to minimize unsightly power leads, although a single lead from a remote sensor to the circuitry within the appliance is sometimes used for remote and/or dual switching control.

It is the principal object of the invention to provide a touch-control power switch of a type which is more convenient to both the manufacturer and user.

According to one general form of the invention there is provided an operator-touch switch for mains power applied to electrical apparatus, such as an electrical lamp, appliance, or machinery, which apparatus includes a connection for power to said apparatus and a series connected power socket in said connection a terminal of which is of jack form to provide an uninterrupted power connection to said apparatus when the socket is vacant, said switch comprises switching electronic circuitry with solid-state components housed within a module having terminal means arranged for plugging-in to said socket, one of said terminal means being of plug form and having two separate conductors connected internally of said module to the input and the output, respectively, of said electronic circuitry whereby when said module is plugged into said socket said electronic circuitry is serially located in said power connection.

The invention will be more readily understood from the following description with reference to the accompanying drawings, in which:

FIG. 1 is an exploded perspective view of a first embodiment in which the switch of the invention is shown as a module for use with an asymmetrical three-pin power plug;

FIG. 3 shows in perspective a switch module unplugged from a three-pin power plug and provided with a remote touch pad;

Figure 2A:
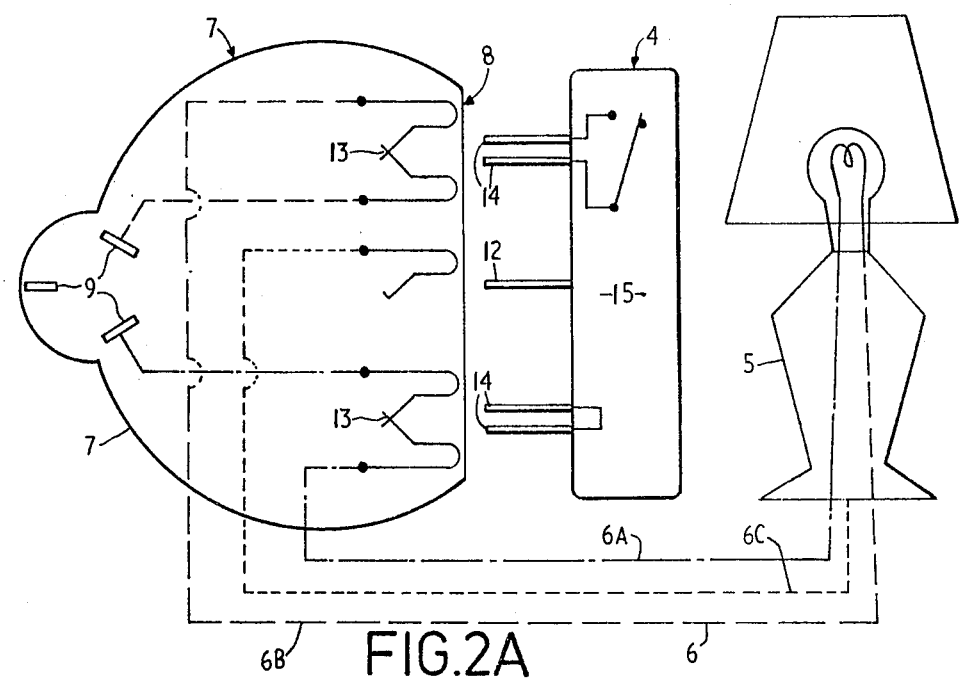
FIGS. 2A and 2B are schematic representations of the module of FIG. 1 in unplugged and plugged conditions, respectively, with respect to the power plug.
Figure 2B:
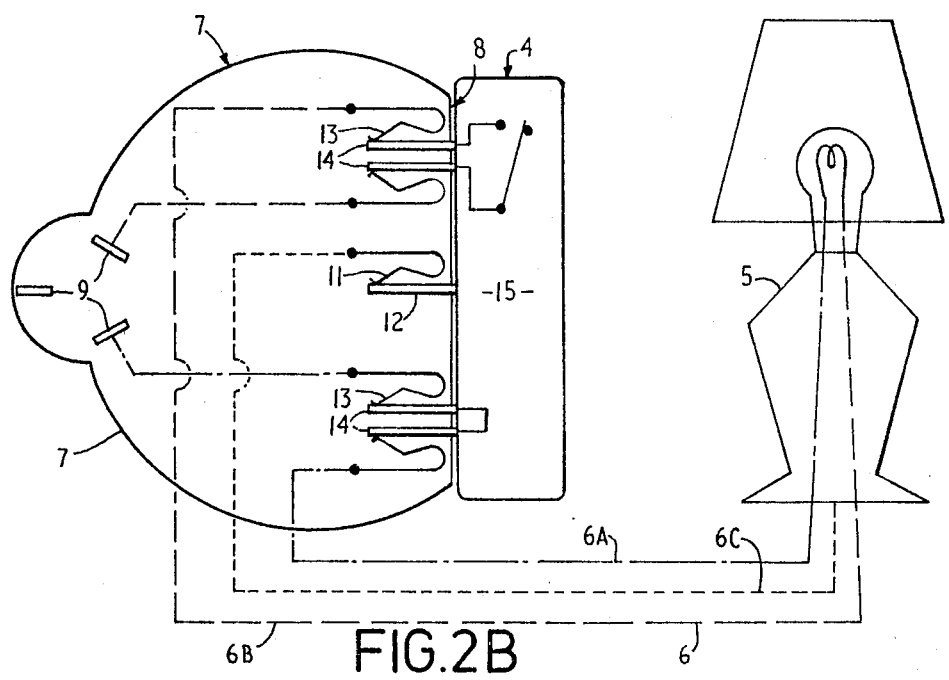

A first embodiment will now be described with reference to FIGS. 1, 2A and 2B in which the switch module 4 of the invention is applied to an electric lamp 5 provided with a power input cord 6 terminating in a three-pin plug-socket 7, the socket 8 being on the opposite side of the plug 7 from its terminal pins 9 with two pin-sockets 10 arranged symmetrically on the plug 7 which are electrically connected respectively to the active and neutral pins 9 of the plug-socket 7. A medial socket 11 for a metal probe 12 is also provided. The two pin-sockets 10 are formed as jacks, i.e. they are provided with sprung, normally closed contacts 13 to effect an uninterrupted power connection to the appliance 5 when the socket 8 is vacant, but are engaged and opened upon insertion of a terminal pin 14. The wiring from the plug-socket 7 is via a three-core flexible cord 6, two of which cores 6A and 6B carry the neutral and active power connections while the remaining core 6C serves either for earthing of the appliance 5, if necessary, or for connection of the body of the appliance 5 to the probe socket 11 of the plug 7. In the latter instance, as shown, the probe 12 inserted into said socket 11 will be the touch-sensor of the electronic circuitry 16 associated with the touch switch.

It is a feature of the invention that the switch module 4 be formed as a housing 15, with removable cover 15A, for the electronic components 17, which are of solid-state form, with one side constructed to contain two protruding terminal means 14 with a protruding touch-sensor probe 12 therebetween to enable the module 4 to be plugged into the socket-jacks 10 and 11 of the plug-socket 7. Due to the symmetrical arrangement of the socket-jacks 10 and 11 and the mating terminal means 14 the module 4 may be plugged-in in either one of two positions rotatably 180° apart thereby to ensure that the electronic circuitry 16 is connected in the sense prescribed to the power source.

As shown, and to provide the above reversibility, each terminal means 14 is composed of a pair of terminal pins or conductors which are connected internally of the module 4 to the electronic circuitry 16. It will be seen that both terminal means 14 are provided in the form of a plug, i.e. they possess two spaced conductors isolated from each other which when plugged into a socket-jack 10 of the plug-socket 7 become electrically connected with respective ones of the contacts 13. A first pair of the conductors of the terminal means 14, intended for connection to the neutral terminal of the power source are electrically connected together by a U-shaped strip 18 and thence to the electronic circuitry 16. The second pair of conductors of the terminal means 14 of the module 4 are connected, respectively, to the power input and power output terminals of the electronic circuitry 16 so that the power source is connected via its active lead to the appliance 5 only when the circuitry 16 has responded to activation of the touch-sensor probe 12.

Thus it will be seen that the appliance 5 receives power under the control of the toucn switch module 4 while when removed from its socket 8 power is continuously applied via the normally closed contacts 13 to the appliance 5 from the power source unless it is separately switched, which is normal practice with domestic power outlets. Should a fault develop in the touch switch circuitry 16, therefore, the module 4 may be unplugged and returned to the vendor for repairs while the appliance 5 remains in service.

It should be apparent that the module 4, if connected in an incorrect sense to the jacks 10 and 11 of the plug-socket 7 may be unplugged and readily reversed due to the symmetry of its terminal means 14. If the plug-socket 7 were itself reversible in its power socket (not shown) as does occur in the case of power plugs with symmetrical terminal pins in some countries, the terminal means 14 of the module 4 for connection to the neutral terminal of the power source may be of solid metal form (not shown) comprising a single conductor.

When earthing of the appliance 5 is required and the third core 6C of the flex 6 provides this earthing, or if otherwise desired, one or more leads as shown in FIG. 3 may be taken from the probe terminal 20 in the module 4 for termination at a metal actuator 21, or actuators, positioned on the appliance 5 and/or elsewhere as desired. In this manner an appliance 5 such as a light fitting may be switched both on and off from a plurality of remote locations, such as at the head and foot of a stairway with the requirement merely of a single electrical lead 19 to each actuator 21.

It will be readily appreciated that a touch switch provided as described above in a single removable module 4 may be of a single design with universal application to many different forms of appliances 5 and electrical apparatus. Thus it would be possible for a manufacturer of various appliances 5 to maintain a single stock of switch modules 4. Furthermore, there is practically no limit to the number of different positions on the appliance 5 or its connecting power lead 6 where the socket 8 for the module 4 may be located. For example, the plug-socket 7 of the drawings may be a conventional power plug connected by power lead to the appliance 5 in known fashion with a socket 8 similar to that shown on the back of the plug-socket 7 provided at the appliance 5. Again appliances 5 may be sold with a plug-socket 7 incorporated with touch switch modules 4 being subsequently purchased by a user when desired.

Merely for purposes of making explicit that which is well known to the prior art in connection with so-called touch switches, a portion of the aforesaid Australian Application Ser. No. 10515/76 is set forth below with reference to FIGS. 4 and 5. More particularly, FIGS. 4 and 5 illustrate a touch-response switch suitable for construction of touch switch module 4.

Figure 4:
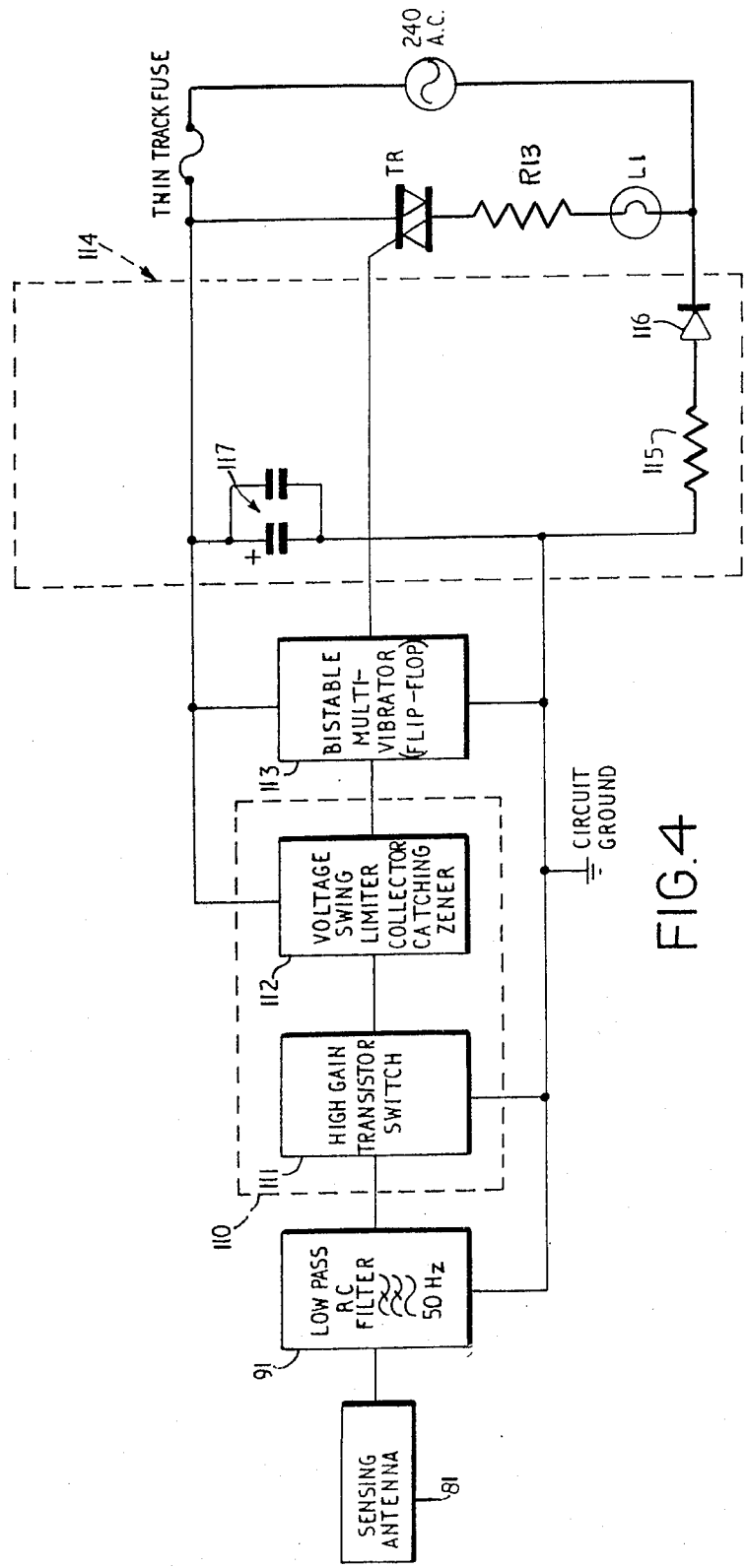
FIG. 4 is a block diagram of the electric power touch switch of the aforesaid Australian Pat. No. 493,215.

Switching by utilizing the touch-response switch apparatus of FIG. 4 is effected by a Triac TR via a fuse and surge limiting resistor R13. Switching of the Triac TR is achieved by activation of trigger switch 110 comprising a high gain transistor switch 111 and a catching Zener diode 112 by the application of 50 Hz "hum" fed through the capacitance of the operator's body to sensing antenna 81 and thence through low pass filter 91. High gain transistor switch 111 passes into saturation upon receipt of the low frequency signal and provides an output signal through bistable multivibrator (flip-flop) 113 to change over the state of Triac TR for "ON" or "OFF" switching. When the apparatus is first connected to the mains Triac TR remains in the "OFF" state and upon repeated touch by the operator on the sensor 81 the state fo the switch repeatedly alternates between "ON" and "OFF".

Figure 5:
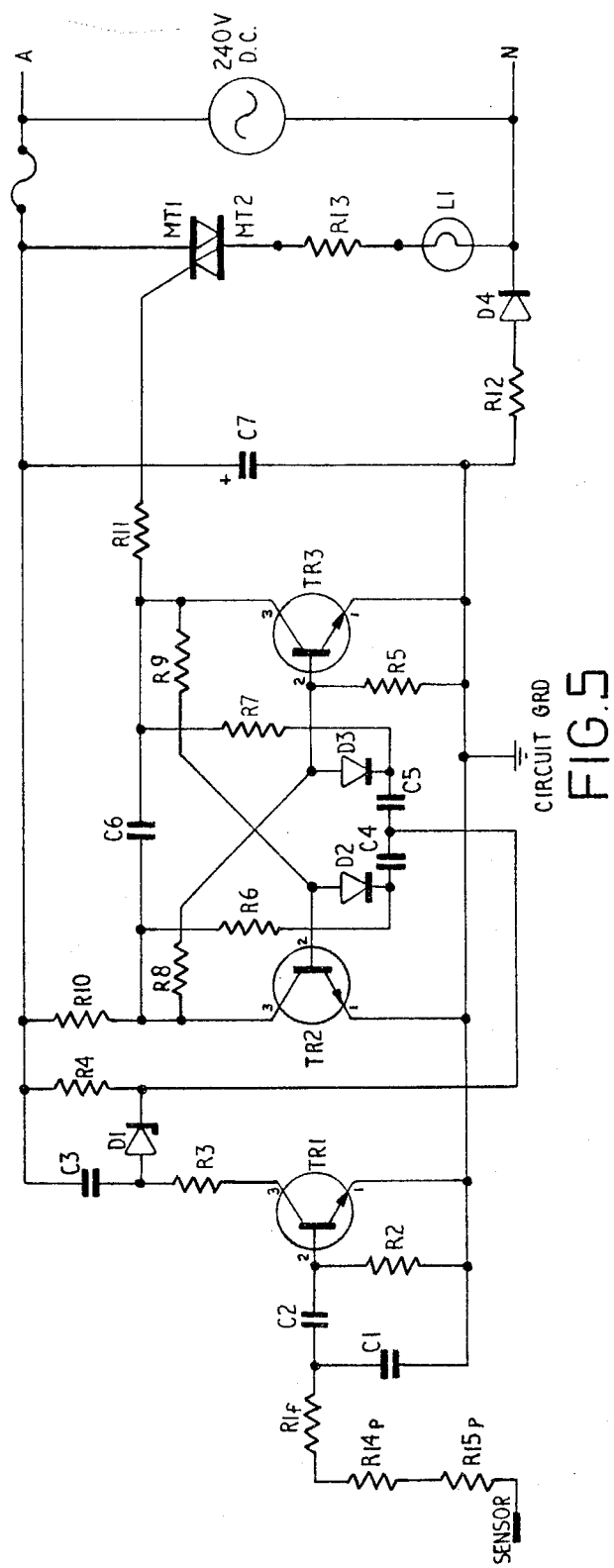
FIG. 5 is an electrical schematic of the touch switch of FIG. 4.

With particular reference to FIG. 5 it is seen that trigger switch 110 comprises transistor TR1 and Zener diode D1, filter 91 comprises capacitor C1, and multivibrator 113 comprises transistors TR2 and TR3 with associated components. Before receipt of a 50 Hz "hum" signal transistor TR1 is normally in the "cut-off" mode. Transistor TR1 is an NPN power transistor which saturates upon receipt of the input signal at its base. The network comprising capacitor C3, resistor R4 and Zener diode D1, acts as a threshold voltage detector where Zener diode D1 acts as a collector diode. In the instance of "NO TOUCH" there is no voltage drop across the collector voltage limiter as transistor TR1 is cut-off. Coupling from the transistor switch TR1 and voltage limiter network to the bistable multivibrator is direct (D.C.). Thus, if the voltage between the cathode of diode D1 to the circuit ground be VT, VT is equal to the D.C. supply voltage (about 20–30 volts) with "NO TOUCH" at the sensing antenna. However, with "TOUCH" transistor TR1 passes into saturation and voltage VT is reduced to approximately 10 volts, thus effectively providing a negative trigger voltage at the base trigger circuit of the bistable multivibrator.

With incandescent bulb L1 of lamp 5 OFF, the multivibrator has transistor TR2 in the ON state and transistor TR3 in the OFF state. Unsymmetrical trigger method is employed to produce only one transistion "per touch". In order to obtain return transition, a second trigger is used (second touch). For a single trigger pulse to complement the multivibrator, a steering arrangement is used so that only the conducting transistor is turned OFF. The nonconducting transistor is turned ON through the cross-coupling network of the multivibrator. To "sense" the state of the flip-flop and feed the negative pulse to the conducting transistor only, each resistor of the steering network (R6, R7) is returned to the transistor collector.

Considering the junctions of the resistor R4, capacitor C3 and diode D1 for each tranistor input, the capacitor feeding the conducting transistor charges up to (VCE (SAT)) and the other to $^VH$. If the signal amplitude is selected to operate the circuit properly (Vt=$^VH$) only the conducting transistor receives a negative pulse. When the trigger pulse goes, effectively, positive, the positive differentiated signal is blocked from appearing at either base. The negative step of the triggering signal causes the voltage across the capacitor feeding the non-conducting transistor to change by $^VH$ volts. But since the capacitor junction voltage was initially at $+^VH$ it goes down to 0 volts. Since the base of the non-conducting transistor is normally a few volts negative, the diode remains reverse biased and no pulse appears at the base.

For the conducting side, the negative voltage step $^VH$ causes the diode to conduct since it was originally at $(^VBE)_{ON}$ at the base, and the negative pulse at the base causes the conducting transistor to turn OFF. Only the conducting transistor receives the negative turn-off signal. When it turns OFF it causes the non-conducting transistor to turn ON through the bistable cross-coupling network completing the inversion or switch over.

On the next trigger pulse the circuit will complement again as the steering is charged oppositely ($+^VH$ again with the non-conductive side) and the bistable returns to the previous state. Thus every trigger pulse causes the flip-flop to complement on the negative going slope input.

When transistor TR3 is on the ON state, a negative gate current (flowing out of the gate) is established. The Triac TR is operated at applied voltages lower than the breakover voltage, and is made to switch to the ON state by gate signal of sufficient amplitude to assure complete turn-on, independent of the applied voltage. Once the Triac TR is triggered to the ON state, the principal current flow is independent of gate voltage or gate current, and the device remains in the ON state until the principal-current flow is reduced to a value below the holding current required to sustain regeneration.

With transistor TR3 ON, the negative gate current turns the Triac TR ON and bulb L1 is turned ON, i.e. the line voltage appears across the load. The next "touch" causes the flip-flop to change state. TR3 is turned OFF which reduces the gate current sufficiently to turn the Triac OFF, i.e. the TRIAC goes into a "blocking" state and the full line voltage appears across it. This means that no voltage appears across the lamp load. Gate (G) is at the same voltage level as main terminal MT1 and there is negligible current in the gate circuit.

The above description gives one cycle of the circuit operation, i.e. LAMP OFF—TOUCH, LAMP ON—TOUCH, LAMP OFF. Subsequent "touches" of sensing antenna 81 goes through the same cycle of operation.

The resistor R13, in series with the bulb L1, acts as a surge limiting resistor. The instant at which the Triac turns on, the LAMP has a very low resistance and hence a "surge" of current would flow through the filament. The resistor R13 limits this surge current until the resistance of the lamp has been brought to a steady state. The D.C. supply of approximately 20–30 volts is derived from a simple half-wave rectified and filtered A.C. supply. The resistor R12 acts as a series voltage drop for the half-wave rectified A.C. supply, thus allowing a filtered D.C. supply of approximately 20–30 volts to be obtained. The A.C. power supply used in this circuit is preferably "floating". In addition to the power supply, all instruments used in testing the switch or other devices in the circuit must be "FLOATING" i.e. the circuit should not be connected or referenced to earth ground by a resistor, wire or capacitor.

With bulb L1 OFF, line voltage appears across Triac TR which is in a blocking state. Touching sensing antenna 81 feeds a 50 HZ "Hum" which saturates a grounded emitter N.P.N. transistor switch which provides a trigger signal for the flip-flop. The flip-flop changes state providing a negative gate current to Triac TR which turns the latter ON and thus the bulb L1 turns ON. Another touch complements the flip-flop which turns the Triac TR OFF and thus the bulb L1 turns OFF.

In a preferred form, the solid state elements of the touch responsive switch are incorporated in a plastic moulding which is disposed within housing 15.

A preferred embodiment has been described above but it will be appreciated that the apparatus may be modified or assume various forms all of which fall within the scope of this invention.

What I claim is:

1. An operator-touch switch assembly for power applied to electrical apparatus, such as an electrical lamp, appliance, and machinery, which apparatus includes a connection for power to said apparatus and a series connected power socket in said connection having a plurality of make-before-break jacks each comprising a pair of normally closed electrical contacts so that the power connection to said apparatus is uninterrupted when the socket is vacant; said switch assembly comprising a housing module; switching electronic circuitry of solid-state components disposed within said housing module; terminal means on said housing module having a first section comprising a pair of spaced pins for plugging-in to a first one of said jacks to engage respective ones of said contacts of said first jack to force them open while maintaining electrical connection therewith and being connected internally of said module across a switching element of said electronic circuitry, and having a second section comprising an electrical conductor for plugging-in to a second one of said jacks to bridge and maintain electrical connection between the normally closed contacts of said second jack; control means for said switching element; and a touch-sensor terminal to which said control means responds; whereby when said module is plugged into said socket said electronic circuitry controls the connection of power to said apparatus.

2. A switch assembly according to claim 1 wherein said first and second jacks are of identical form and are symmetrically arranged about the axis of said power socket to permit plugging-in to the socket of said terminal means in either of two selected angularly rotated positions for facilitating polarity reversal of power connected to said electronic circuit.

3. A switch assembly according to claim 1, wherein the socket has a medial terminal connected to a touch-sensor lead embodied in said power connection to the electrical apparatus, and said module has a medial pin connected with its touch-sensor terminal for electrical connection with said medial terminal when the module is plugged in to the socket.

4. A switch assembly according to claim 1, wherein said socket is provided on the rear of a power plug and at one end of said power connection remote from the electrical apparatus.

5. A switch assembly according to claim 1, wherein a touch-sensor lead is connected directly to the touch-sensor terminal of the module and is connected at its remote end to a touch-sensor pad.

* * * * *